United States Patent
Groe et al.

(10) Patent No.: US 7,109,815 B1
(45) Date of Patent: *Sep. 19, 2006

(54) VCO WITH AUTOMATIC CALIBRATION

(75) Inventors: John Groe, Poway, CA (US); Joseph Austin, San Diego, CA (US)

(73) Assignee: Sequoia Communications Corp, San Diego, CA (US)

( * ) Notice: Subject to any disclaimer, the term of this patent is extended or adjusted under 35 U.S.C. 154(b) by 78 days.

This patent is subject to a terminal disclaimer.

(21) Appl. No.: 11/027,793

(22) Filed: Dec. 31, 2004

Related U.S. Application Data

(63) Continuation of application No. 10/418,732, filed on Apr. 17, 2003, now Pat. No. 6,856,205.

(60) Provisional application No. 60/373,177, filed on Apr. 17, 2002.

(51) Int. Cl.
*H03B 5/12* (2006.01)
*H03L 7/087* (2006.01)
*H03L 7/099* (2006.01)
*H03L 7/10* (2006.01)

(52) U.S. Cl. ............ 331/179; 331/1 A; 331/11; 331/17; 331/36 C; 331/117 R; 331/177 V

(58) Field of Classification Search ............... 331/1 A, 331/8, 10–12, 16–18, 25, 34, 36 C, 117 R, 331/117 FE, 117 D, 177 R, 177 V, 179, DIG. 2
See application file for complete search history.

(56) References Cited

U.S. PATENT DOCUMENTS 6,856,205 B1 * 2/2005 Groe et al. ............... 331/17

\* cited by examiner

*Primary Examiner*—David Mis

(57) ABSTRACT

Voltage-controlled oscillator with apparatus for automatic calibration. The voltage-controlled oscillator includes switches connecting associated coarse-tuning capacitors to an LC resonant tank of the oscillator. The voltage-controlled oscillator also comprises a calibration loop used to appropriately set the switches associated with the coarse tuning capacitors based on a oscillator control signal.

7 Claims, 7 Drawing Sheets

VCO WITH AUTOMATIC CALIBRATION

CROSS REFERENCE TO RELATED APPLICATIONS

This application is a Continuation Application of U.S. patent application Ser. No. 10/418,732 filed on Apr. 17, 2003, now U.S. Pat. No. 6,856,205. The application Ser. No. 10/418,732 claimed the benefit of priority from a co-pending U.S. Provisional Patent Application entitled "VCO WITH AUTOMATIC CALIBRATION" Ser. No. 60/373,177 filed on Apr. 17, 2002, the disclosure of which is incorporated by reference herein in its entirety for all purposes.

FIELD

The present invention relates generally to voltage-controlled oscillators, and more particularly, to automatic calibration of voltage-controlled oscillators with coarse tuning elements to operate over a wide frequency band or multiple frequency bands.

BACKGROUND

Voltage-controlled oscillators (VCO) are critical components in phase-locked loop (PLL) circuits used to synthesize radio frequencies in communication transceivers. A typical PLL circuit is shown in FIG. 1. The PLL implements a feedback system and consists of a VCO, N counter, phase/frequency detector (P/FD) and charge pump (CP). The feedback drives the phase difference ($\Delta\theta$) between the reference signal (Ref) and the output of the N counter towards zero by creating a control voltage $v_{ctrl}$ that adjusts the VCO to the proper frequency and phase offset. When locked, the PLL generates an output signal (RF signal) with a frequency $f_{VCO}$ equal to;

$$f_{VCO} = Nf_{REF}$$

where N is the value of the N-counter and $f_{REF}$ is the frequency of the reference signal.

The PLL and associated VCO typically support one or more frequency bands. A single frequency band, such as those used in the Personal Communication System (PCS) or the Universal Mobile Telephony System (UMTS), spans 60 MHz, while these two bands together cover 180 MHz. However, using a conventional VCO to cover such a wide frequency band or multiple bands produces degraded performance and phase noise. This makes the PLL design especially challenging.

Therefore, it would be advantageous to have a VCO that can operator over a wide frequency range without sacrificing performance or degraded phase noise.

SUMMARY

In one or more embodiments, a PLL system that includes automatic calibration and coarse tuning of a VCO is provided. Because of the automatic calibration of the VCO, the PLL system is capable of operating over a wide frequency range.

In one embodiment included in the present invention, apparatus is provided for automatic tuning of a voltage-controlled oscillator within a phase-locked loop. The apparatus comprises a voltage-controlled oscillator that includes switches connecting associated coarse-tuning capacitors to an LC resonant tank of the oscillator. The apparatus also comprises a calibration loop used to appropriately set the switches associated with the coarse tuning capacitors.

In another embodiment included in the present invention, a method is provided for automatic tuning of a voltage-controlled oscillator within a phase-locked loop. The method comprises steps of operating a phase-locked loop that includes a voltage-controlled oscillator with coarse-tuning elements, setting switches in a way that successively disconnects coarse-tuning elements to the voltage-controlled oscillator, monitoring a phase-locked loop control voltage after each successive switch is opened, and indicating whether the control voltage is above, below, or within a prescribed operating range.

In another embodiment included in the present invention, apparatus is provided for monitoring the control voltage generated by the phase-locked loop. The apparatus comprises a reference circuit that produces two voltages that define the prescribed operating range for the phase-locked loop's control voltage, a set of comparators that connect to the phase-locked loop's control voltage as well as one each of the two voltages produced by the reference circuit, producing a pair of output signals, and a latch generator that drives a pair of latches used to sample the output of the comparators.

In another embodiment included in the present invention, apparatus is provided for generating a latch signal that samples the output of a window comparator. The apparatus comprises a counter, initialized each time a coarse-tuning element is switched, that produces an output signal after a period of time equal to or greater to than the longest settling delay of a phase-locked loop.

In another embodiment included in the present invention, apparatus is provided for generating a latch signal that samples the output of a window comparator. The apparatus comprises a differentiating circuit coupled to the control signal of the phase-locked loop that produces a derivative signal, an absolute function circuit that operates on the derivative signal and produces a settling error signal, and a comparator that toggles every time the settling error drops below a prescribed threshold and thus provides the latch signal.

In another embodiment, a communication device is provided that comprises a PLL and associated VCO, wherein the VCO comprises an LC resonant tank circuit and the communication device further comprises apparatus for automatic calibration of the VCO. The apparatus comprises a plurality of coarse-tuning capacitors, and a plurality of switches operable to selectively connect the plurality of coarse-tuning capacitors to the LC resonant tank circuit based on a VCO control voltage.

BRIEF DESCRIPTION OF THE DRAWINGS

The foregoing aspects and the attendant advantages of the embodiments described herein will become more readily apparent by reference to the following detailed description when taken in conjunction with the accompanying drawings wherein.

DETAILED DESCRIPTION

In one or more embodiments, a PLL system that includes automatic calibration and coarse tuning of a voltage-controlled oscillator is provided.

Figure 1:
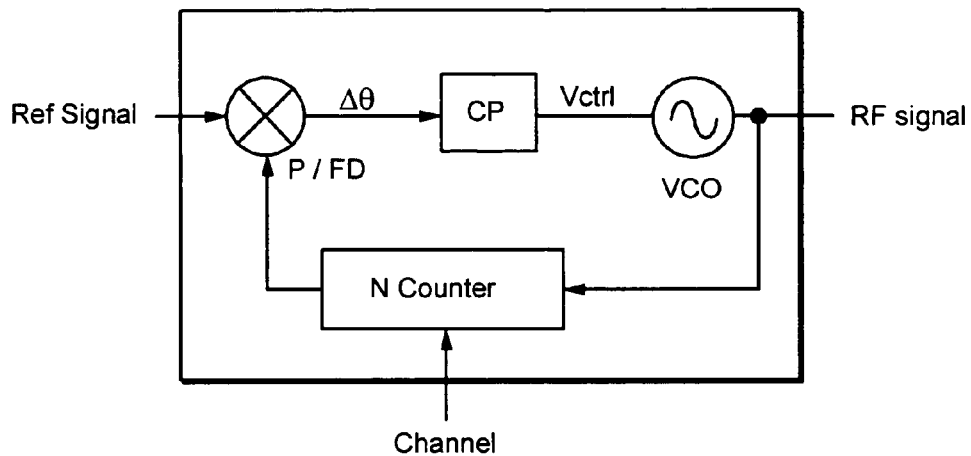
FIG. 1 shows a diagram of a typical PLL circuit.
Figure 2:
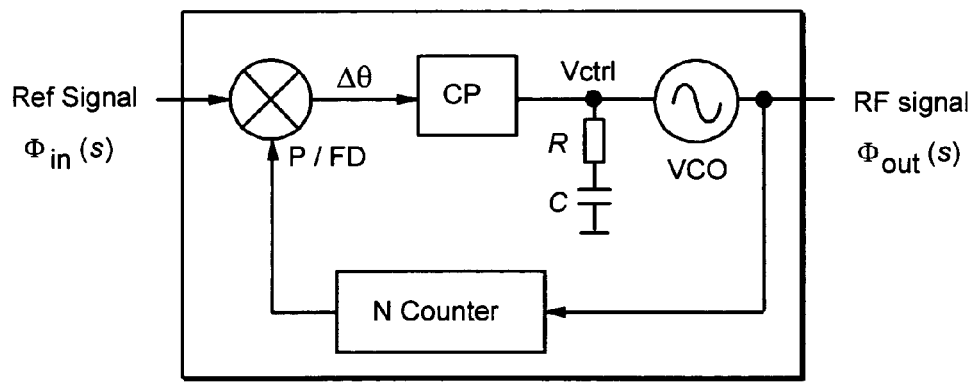
FIG. 2 shows a PLL feedback system used to synthesize a radio frequency (RF) carrier signal.

FIG. 2 shows a PLL feedback system used to synthesize a radio frequency (RF) carrier signal. The system comprises a voltage-controlled oscillator (VCO), N counter, phase/frequency detector (P/FD), charge pump (CP), and integration filter. The integration filter comprises resistor (R) and capacitor (C).

Figure 3:
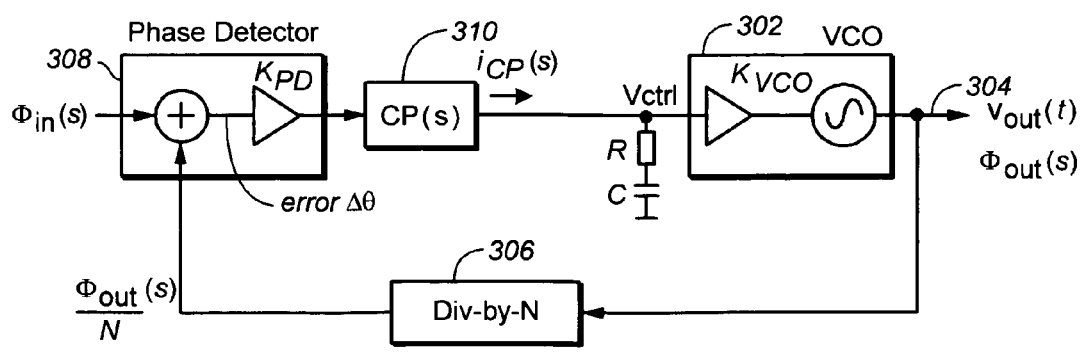
FIG. 3 shows a mathematical model of the PLL system of FIG. 2.

FIG. 3 shows a mathematical model of the PLL system of FIG. 2. The VCO 302 produces an output signal 304 at a frequency set by control voltage $v_{ctrl}$, which can be expressed as;

$$v_{out}(t) = A_c \cos(\omega_{free} t + K_{vco} \int v_{ctrl}(t) dt)$$

where $\omega_{free}$ is the free-running frequency of the oscillator and $K_{vco}$ is its gain function. The gain function $K_{vco}$ describes the relationship between the excess phase of the carrier $\Phi_{out}(s)$ and the control voltage $v_{ctrl}$, i.e.;

$$\frac{\Phi_{out}(s)}{v_{ctrl}(s)} = \frac{K_{vco}}{s}$$

The N counter 306 simply divides the output phase $\Phi_{out}(s)$ by N. When the PLL is locked, the phase/frequency detector 308 and charge pump 310 generate a charge pump output signal $i_{cp}(s)$ based the phase difference $\Delta\theta$ between the N counter's output signal and the reference signal (Ref) expressed as;

$$i_{CP}(s) = K_{PD} \frac{\Delta\theta(s)}{2\pi}$$

A simple integration filter, consisting of resistor R and capacitor C, transforms the charge pump output signal to the control voltage ($V_{ctrl}$), where;

$$v_{ctrl}(s) = i_{CP}(s)\left(R + \frac{1}{sC}\right)$$

Combining the above transfer functions yields the following composite transfer function;

$$T(s) = \frac{K_{PD}K_{VCO}\left(Rs + \frac{1}{C}\right)}{s^2 + K_{PD}K_{VCO}\frac{1}{N}\left(Rs + \frac{1}{C}\right)}$$

where a zero (at 1/RC) provides added stability to the second order system.

The behavior of the feedback system depends on key parameters in the transfer function, namely the damping factor $\zeta$ and the natural frequency $\omega_n$ of the system. These parameters are found by mapping the denominator of the composite transfer function to the general $2^{nd}$ order characteristic equation $s^2 + 2\zeta\omega_n s + \omega_n^2$.

In practice, the values of $K_{PD}$ and $K_{vco}$ change with control voltage $v_{ctrl}$. This is because both the charge pump current $i_{cp}(s)$ (which affects $K_{PD}$) and the response of a variable capacitor in the VCO (which affects $K_{VCO}$) vary with the level of $v_{ctrl}$. The variable capacitor is actually nonlinear and its operating range is important. A large operating range allows the VCO to be tuned over a wide bandwidth of frequencies. However, this also results in a large sensitivity to $v_{ctrl}$ and thus increases the noise level of the PLL. In contrast, a small operating range reduces the system's sensitivity to noise while shrinking the VCO's tuning range.

Figure 4:
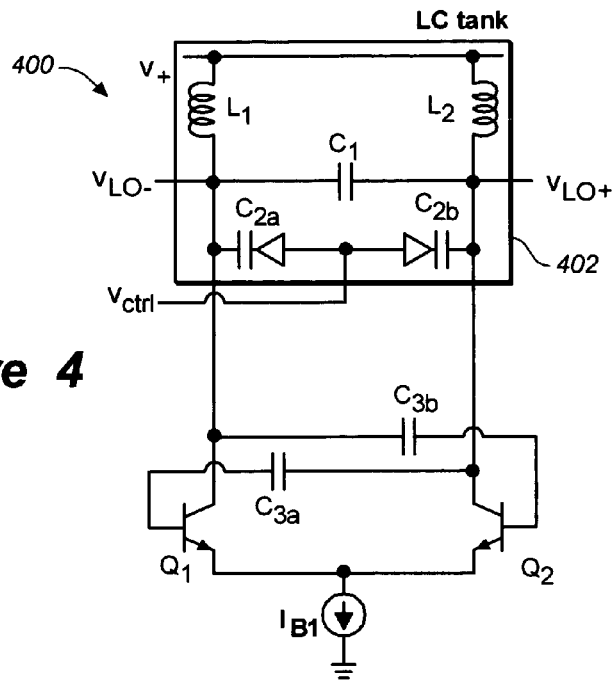
FIG. 4 shows one embodiment of a VCO.

FIG. 4 shows one embodiment of a VCO 400. The VCO 400 oscillates at a radio frequency set by the resonance of an LC tank circuit 402. A variable capacitor $C_2$—that may be realized as a varactor diode—allows the VCO 400 to be tuned to different radio frequencies. Capacitors $C_{3a}$ and $C_{3b}$ cross-couple the output signal ($V_{LO}$) and provide positive feedback to a transistor differential pair (Q1, Q2) to replace energy lost in the resonant LC tank 402, and thereby sustain oscillation.

Figure 5:
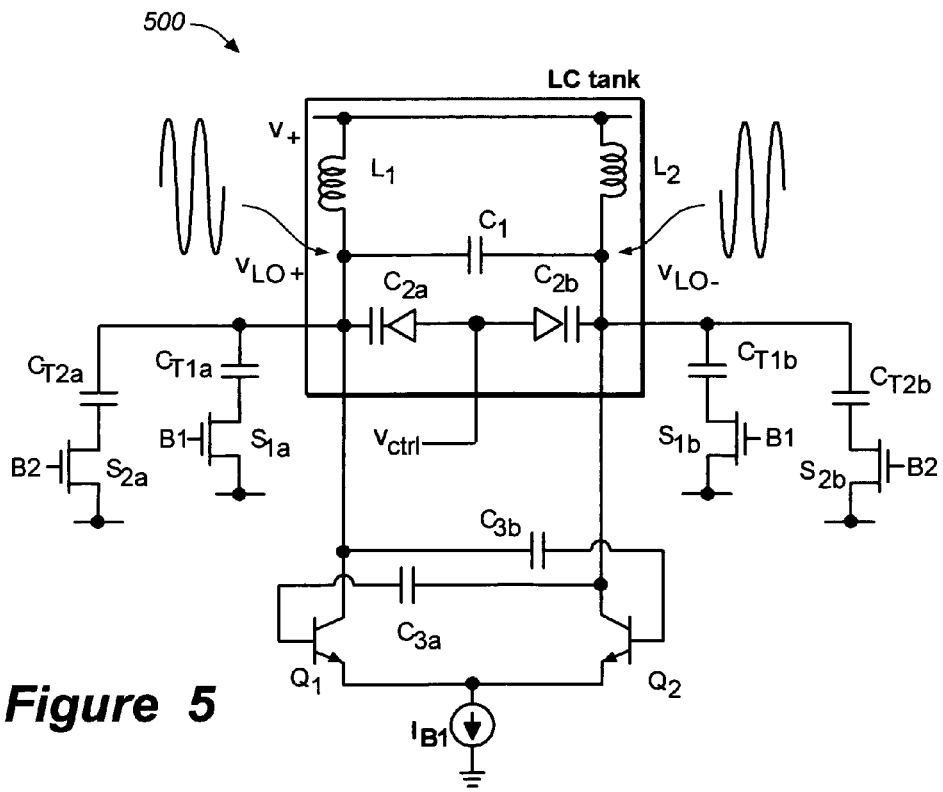
FIG. 5 shows one embodiment of a VCO with course tuning capacitors constructed in accordance with the present invention.

FIG. 5 shows one embodiment of a VCO 500 with course tuning capacitors constructed in accordance with the present invention. The coarse tuning capacitors ($C_{T1a}$, $C_{T2a}$, $C_{T1b}$, and $C_{T2b}$) are typically binary weighted and subdivide the tuning range so that the sensitivity of the VCO (at the varactor $C_2$) can be reduced. The course tuning capacitors are also referred to tuning elements, and it is also possible that any other suitable tuning element may be substituted for the coarse tuning capacitors.

The NMOS transistors ($S_{1a}$, $S_{2a}$, $S_{1b}$, and $S_{2b}$) operate as switches. The switch control signals B1 and B2 are used to activate or deactivate the switches. Since these switches are not ideal, they present a limited impedance when in the off state and a non-zero impedance when in the on state. The limited off impedance is due to the drain-gate capacitance of the MOSFETs, which adds unwanted capacitance to the VCO 500. This unwanted capacitance limits the maximum frequency of oscillation and reduces the capacitance change attributed to the coarse-tuning capacitors. The non-zero on impedance is due to the channel resistance of the MOSFETs, which impacts the quality factor (Q) of the coarse-tuning capacitors and consequently degrades the phase noise of the VCO 500. As a result, there is a limit on the number or coarse-tuning capacitors that may be used before degraded VCO performance occurs. In one embodiment, the switches (S) may comprise mechanical switches or any other suitable type switch.

Figure 6:
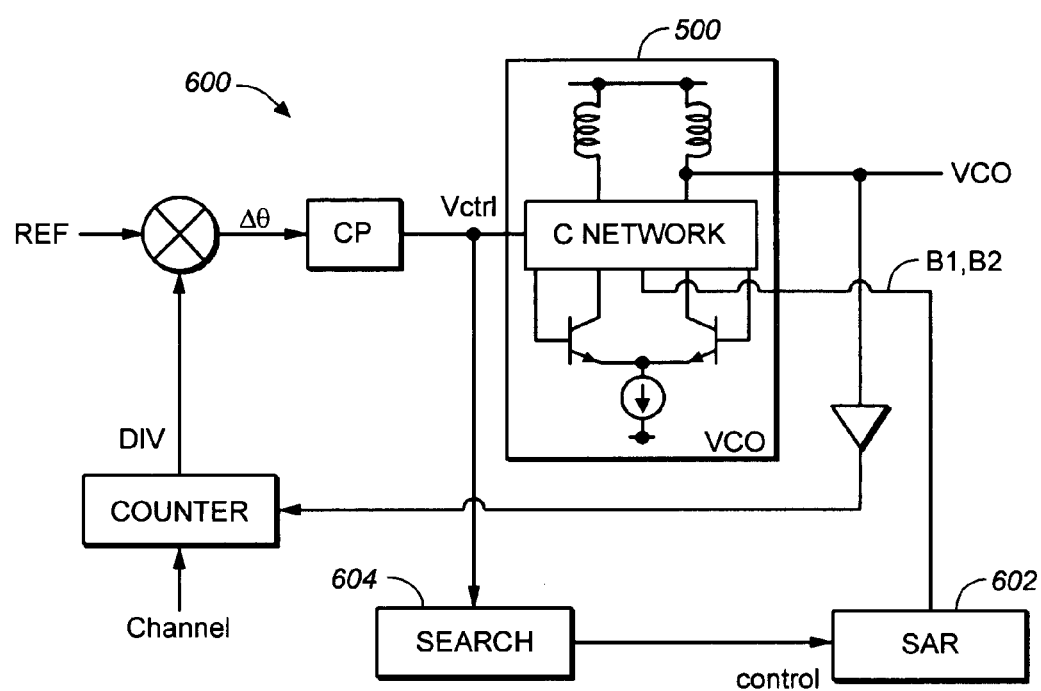
FIG. 6 shows a functional diagram of one embodiment of a PLL system constructed in accordance with the present invention that comprises the VCO with coarse tuning capacitors, as shown in FIG. 5.

FIG. 6 shows a functional diagram of one embodiment of a PLL system 600 constructed in accordance with the present invention that comprises the VCO 500 with coarse tuning capacitors and switches as shown in FIG. 5 represented as (C Network). The system 600 also includes a successive approximation register (SAR) 602 that comprises a group of settable output bits (i.e., bits B1 and B2 in this embodiment), which are coupled to the switches (S). The system 600 also comprises search logic 604 that is used to control the SAR 602. The search logic 604 and the SAR 602 form a calibration loop with the VCO.

Figure 7:
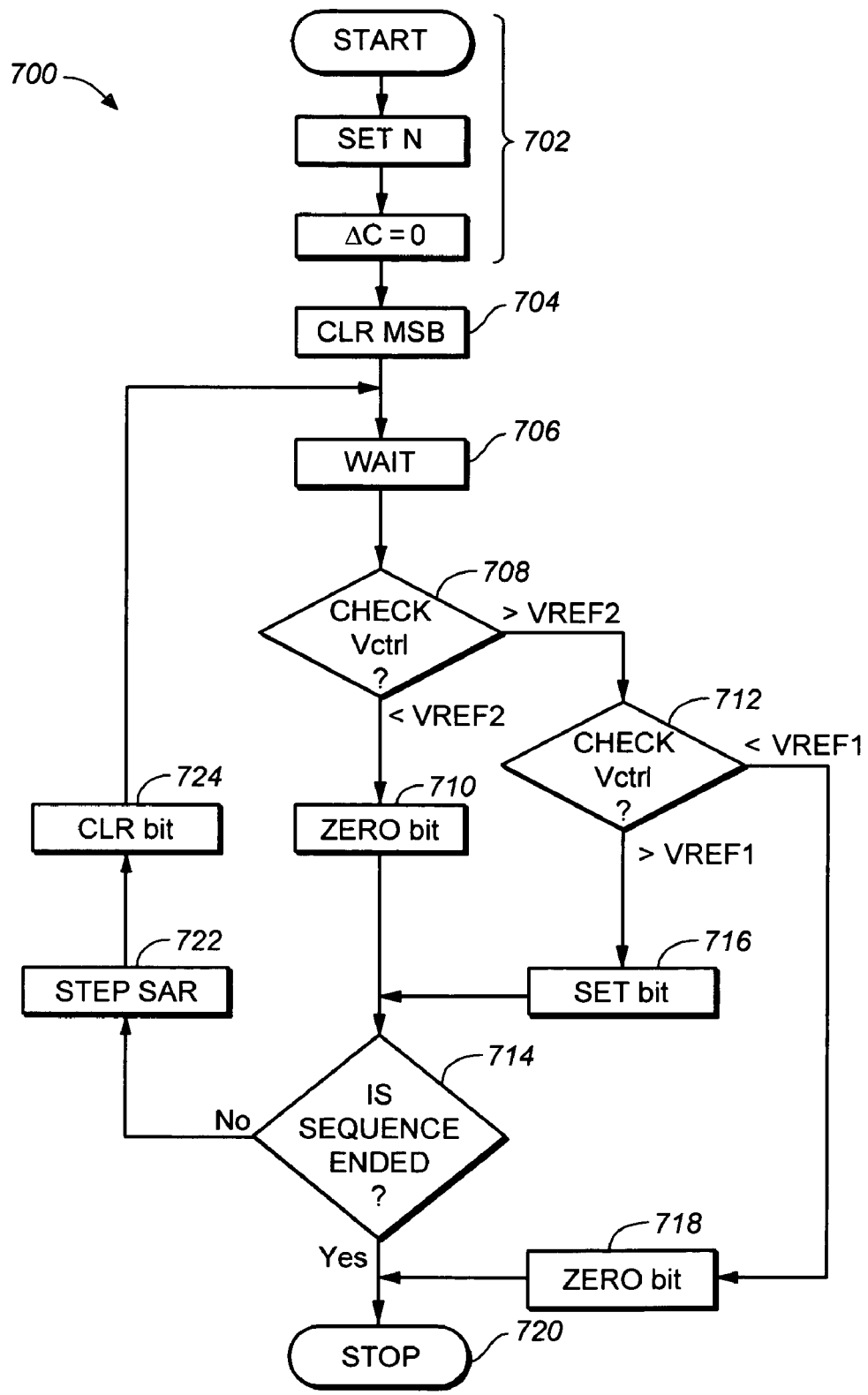
FIG. 7 shows one embodiment of a successive approximation algorithm for adjusting a control voltage ($v_{ctrl}$) of the PLL system shown in FIG. 6 in accordance with the present invention.

FIG. 7 shows one embodiment of a successive approximation algorithm 700 for adjusting a control voltage ($v_{ctrl}$) of the PLL system 600 shown in FIG. 6 in accordance with the present invention. The algorithm 700 operates to step the values of the coarse-tuning capacitors (i.e., selectively enabling capacitors via the switches) of the VCO 500 until the control voltage $v_{ctrl}$ is centered midway between ground and V$^+$.

The algorithm 700 performs an initialization 702 by setting the successive approximation register (SAR) 602, which connects the coarse-tuning capacitors to the LC resonant tank of the VCO 500 by setting the bits B1 and B2. As a result, the VCO oscillates at its minimum frequency—outside the frequency band and well below the program frequency (set by the value applied to the N counter). The phase/frequency detector drives the charge pump down ($v_{ctrl}$ approaches ground and thereby decreases the capacitance of the varactor diode), in an attempt to increase the VCO's frequency of oscillation high enough to obtain frequency lock.

At 704, the SAR is then triggered to clear its first bit, which disconnects the coarse-tuning capacitors $C_{T1a}$ and $C_{T1b}$ from the LC resonant tank of the VCO. This further decreases the capacitance of the LC resonant tank and raises the VCO's frequency of oscillation. At 706, a wait is performed to allow the control signal $v_{ctrl}$ to settle.

At 708, a test is performed to compare the $v_{ctrl}$ signal to the reference voltage (VREF2). If the $v_{ctrl}$ is less than VREF2 the method proceeds to block 710. If the $v_{ctrl}$ is greater than VREF2 the algorithm proceeds to block 712.

At block 710, the bit in the SAR register is set to zero and the algorithm proceeds to block 714. At block 712, a test is performed to compare the $v_{ctrl}$ signal to the reference voltage (VREF1). If the $v_{ctrl}$ signal is greater than VREF1 the algorithm proceeds to block 716. If the $v_{ctrl}$ signal is less then VREF1 the algorithm proceeds to block 718.

At block 718, the bit is set to zero and the algorithm proceeds to block 720 where the algorithm is completed. At block 716, the bit is set to one and the algorithm proceeds to block 714. At block 714, a test is performed to determine if more bits in the SAR register need to be evaluated. If more bits need to be evaluated, the algorithm proceeds to block 722 where the SAR is stepped to the next bit. At block 724, that bit is cleared and the algorithm proceeds to block 706 to process that bit. Thus, the algorithm sets or clears the bits (B) in the SAR register, which activate or deactivate the switches (S), until the $v_{ctrl}$ signal reaches the desired level.

In one embodiment, if the removal of coarse-tuning capacitors $C_{T1a}$ and $C_{T1b}$ (controlled by bit B1) causes $v_{ctrl}$>V$_{REF1}$, then the associated tuning switch S$_1$ is closed and the next tuning switch S$_2$ is opened by clearing B2, thereby removing $C_{T2a}$ and $C_{T2b}$ from the circuit, which represent approximately one-half of the previous coarse-tuning capacitance of $C_{T1a}$ and $C_{T1b}$.

If the removal of the capacitors $C_{T1a}$ and $C_{T1b}$ causes $v_{ctrl}$<V$_{REF1}$, then the associated tuning switch S$_1$ remains opened. If, even after the addition of the capacitors $C_{T1}$ and $C_{T1b}$, $v_{ctrl}$<V$_{REF1}$, then the next tuning switch S$_2$ is opened. If V$_{REF1}$>$v_{ctrl}$>V$_{REF2}$, then the coarse tuning capacitor network is properly adjusted and the program is terminated.

The tuning capacitors $C_{T1}$ and $C_{T2}$ are binary weighted, with capacitors $C_{T2}$ slightly more than one-half the value of capacitors $C_{T1}$. This ensures that the tuning ranges overlap.

Figure 8:
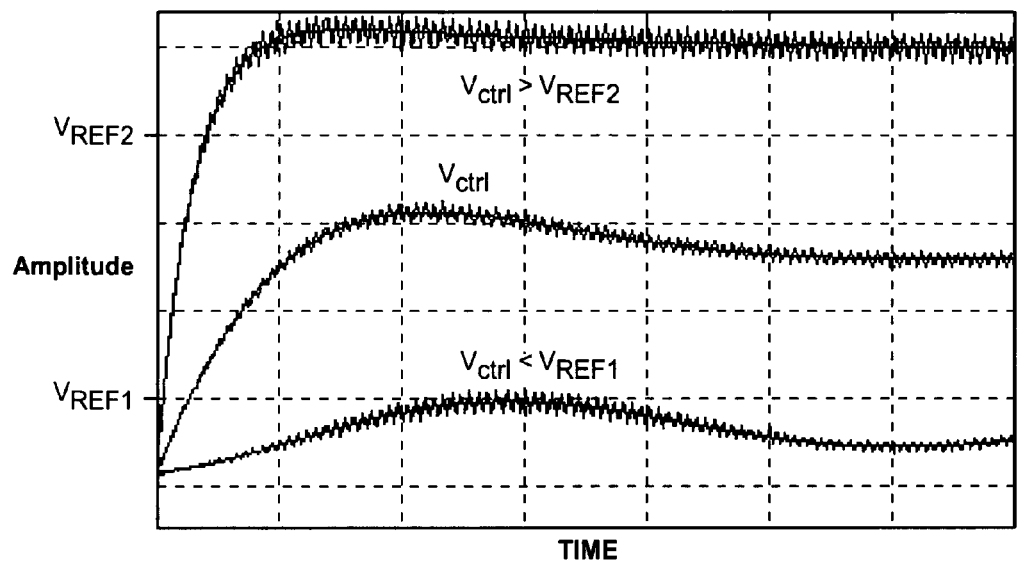
FIG. 8 shows a graph that illustrates how the feedback system of the PLL's of FIG. 6 responds in one of the three ways to the level of the $v_{ctrl}$ signal.

FIG. 8 shows a graph that illustrates how the PLL's feedback system responds in one of the three ways to the $v_{ctrl}$ signal. First, the resulting VCO frequency may still be too low, causing little effect on the charge pump output and keeping $v_{ctrl}$ near ground. Second, the resulting VCO frequency may allow frequency lock, meaning the faster output of the N counter now matches the frequency of the reference signal. As a result, the charge pump output steps to a level midway between the ground and the positive supply (V$^+$). Lastly, the resulting VCO frequency may be too high, causing the charge pump output to jump towards the positive supply. Operation of the VCO depends on the program frequency and the value of the coarse-tuning capacitors.

Figure 9:
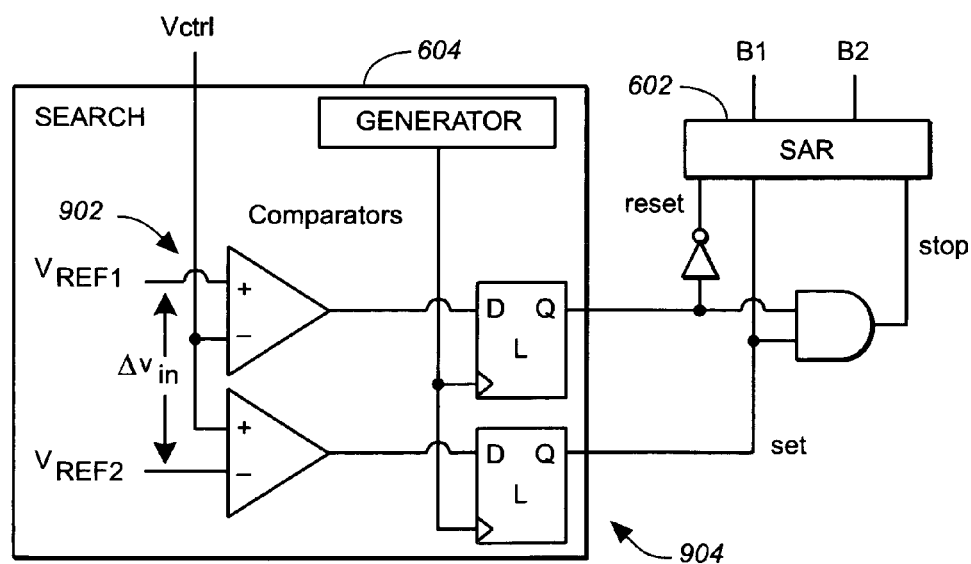
FIG. 9 shows a detailed diagram of one embodiment of the search network and SAR register shown in FIG. 6 constructed in accordance with the present invention.

FIG. 9 shows a detailed diagram of one embodiment of the search network 604 and SAR register 602 shown in FIG. 6 constructed in accordance with the present invention. The search network 604 comprises a window comparator 902 used to monitor the charge pump output voltage ($v_{ctrl}$). Ideally, the ($v_{ctrl}$) signal level is centered midway between ground and V$^+$. Obtaining a centered ($v_{ctrl}$) is one of the goals of the VCO coarse tuning algorithm. The window comparator 902 compares the control voltage $v_{ctrl}$ to two reference voltages (V$_{REF1}$ and V$_{REF2}$) that correspond to the preferred operating range of the charge pump and varactor diode in the VCO. The two reference voltages are the reference voltages used in the algorithm shown in FIG. 7.

Each time the coarse-tuning capacitors are switched (via the (B) bits) the control signal $v_{ctrl}$ changes. The response can be subtle or abrupt. Nonetheless, the outputs of the window comparator 902 cannot be latched by latch circuit 904 until after the control signal $v_{ctrl}$ has settled. The settling time for the control signal $v_{ctrl}$ can be approximated for a second order system by;

$$t = -\frac{1}{\zeta\omega_n}\ln(\delta\sqrt{1-\zeta^2})$$

where δ is the settling time error and the change in control voltage $v_{ctrl}$ is abrupt (i.e. step input).

Figure 10:
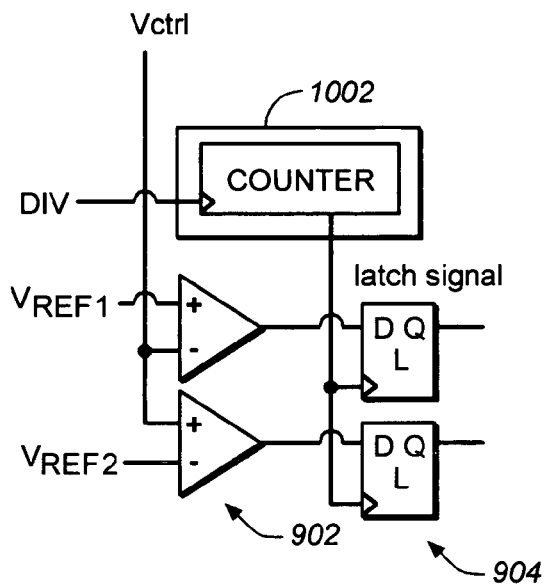
FIG. 10 shows one embodiment of a search network that operates to ensure that settling of the control signal $v_{ctrl}$ has occurred.

FIG. 10 shows one embodiment of the search network 604 that operates to ensure settling of the control signal $v_{ctrl}$ has occurred. In one embodiment, a counter 1002 is used to delay the output of a latch signal applied to the latch circuit 904 until the PLL's maximum settling time has elapsed. The signal (DIV) is either the output of the N counter or the reference signal input to the phase/frequency detector.

Figure 11:
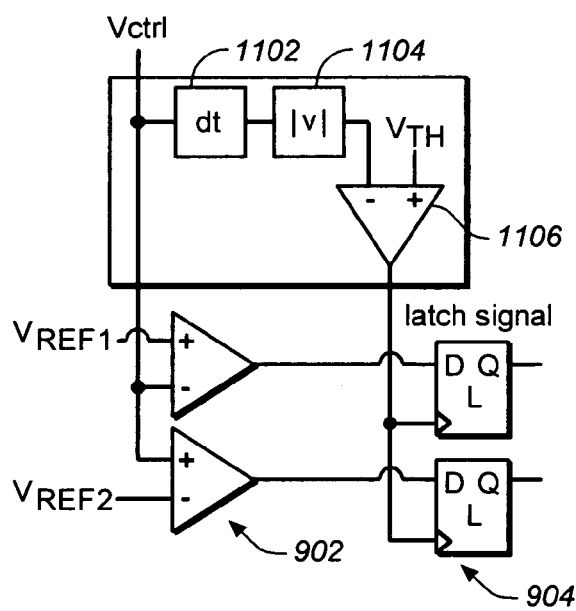
FIG. 11 shows another embodiment of a search network that operates to ensure that settling of the control signal $v_{ctrl}$ has occurred.

FIG. 11 shows another embodiment of the search network 604 that operates to ensure settling of the control signal $v_{ctrl}$ has occurred. In one embodiment, the derivative of the control signal $v_{ctrl}$ is monitored, and this derivative approaches zero as the $v_{ctrl}$ settles towards its final value. This embodiment comprises a differentiating circuit that comprises a differentiator 1102, absolute function circuit 1104, and a comparator 1106. The output of the comparator 1106 is used to latch the latch circuit 904.

The successive approximation register (SAR) 602 controls switches S1 and S2 through the bits B1 and B2. This can be expanded to additional bits with associated switches and coarse tuning capacitors. However, the practical limit is about four bits as the effects of the coarse-tuning network on the VCO become increasing more severe.

Figure 12:
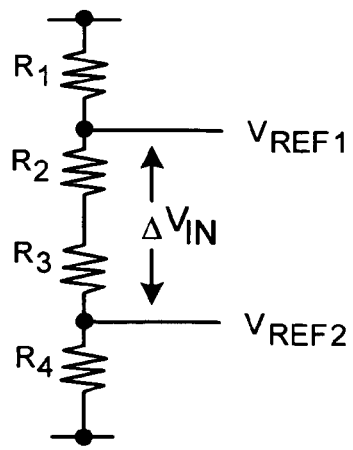
FIG. 12 shows one embodiment of a circuit for generating reference voltages $V_{REF1}$ and $V_{REF2}$.

FIG. 12 shows one embodiment of a circuit for generating the reference voltages $V_{REF1}$ and $V_{REF2}$. The reference voltages are formed using a simple resistor divider comprising four resistors (R1–R4).

Figure 13:
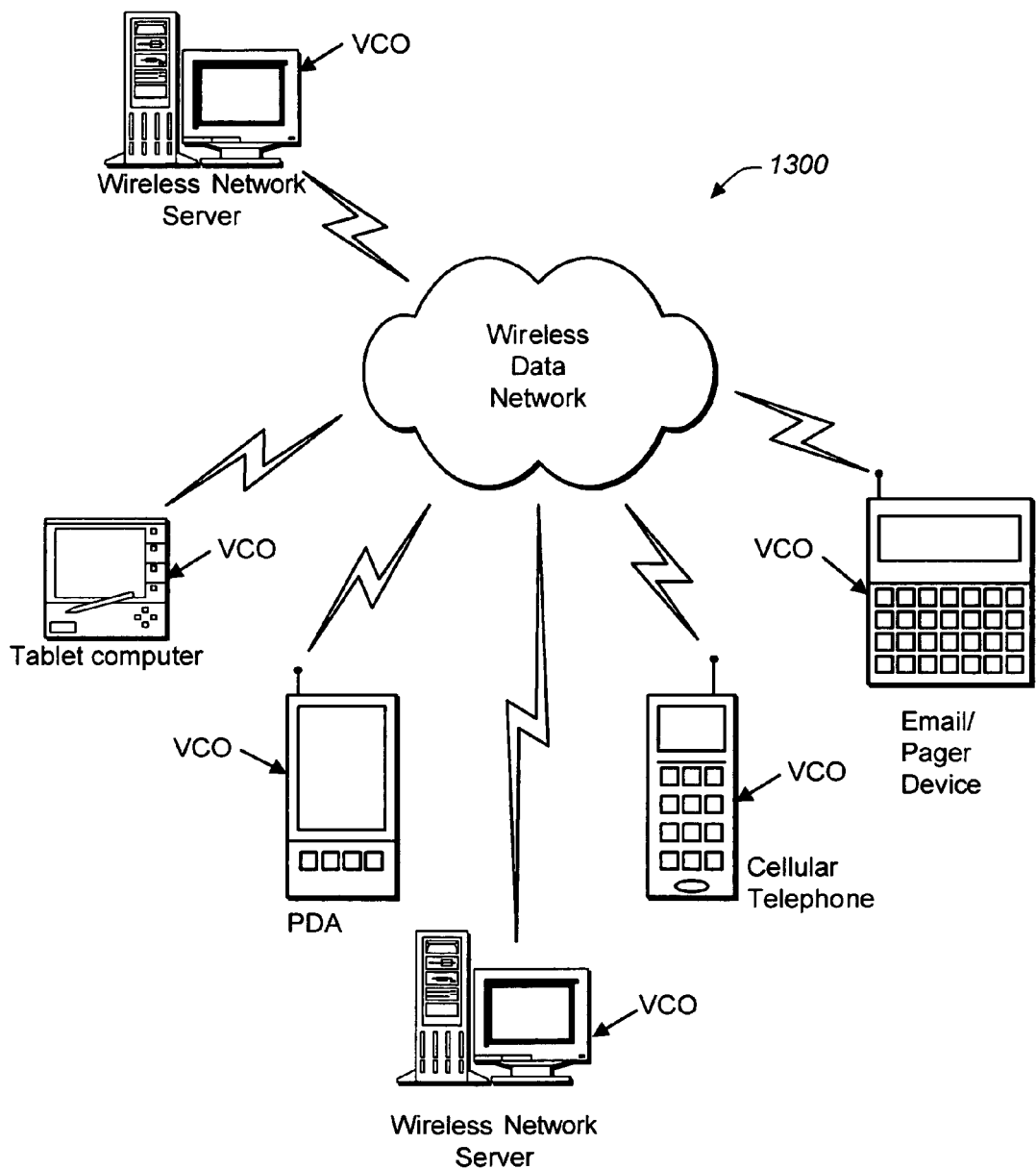
FIG. 13 shows a communication network that includes various communication devices that comprise PLL systems with VCOs constructed in accordance with the present invention.

FIG. 13 shows a communication network 1300 that includes various communication devices that comprise PLL systems with VCOs constructed in accordance with the present invention. The network 1300 includes multiple network servers, a tablet computer, a personal digital assistant (PDA), a cellular telephone, and an email/pager device all communicating over a wireless data network. Each of the devices includes a PLL system that includes automatic calibration and coarse tuning of a voltage-controlled oscillator in accordance with the present invention. The network 1300 illustrates only some of the devices that may comprise one or more embodiments included in the present invention. However, one or more embodiments included in the present invention are suitable for use in virtually any type of communication device.

In one or more embodiments, a PLL system that includes automatic calibration and coarse tuning of a voltage-controlled oscillator is provided. Accordingly, while one or more embodiments of a PLL system have been illustrated and described herein, it will be appreciated that various changes can be made to the embodiments without departing from their spirit or essential characteristics. Therefore, the disclosures and descriptions herein are intended to be illustrative, but not limiting, of the scope of the invention, which is set forth in the following claims.

What is claimed is:

1. Apparatus for automatic tuning of a voltage-controlled oscillator, the apparatus comprising:

one or more switches operable to selectively connect and disconnect one or more coarse-tuning elements to an LC resonant tank of the oscillator;

logic configured to operate the one or more switches; and logic configured to provide a selected settling time based on a characteristic of a control signal.

2. The apparatus of claim 1, wherein the one or more coarse-tuning elements comprise one or more capacitors.

3. The apparatus of claim 1, wherein the one or more switches comprise one or more transistors.

4. The apparatus of claim 1, wherein the control signal comprises a voltage control signal input to the voltage-controlled oscillator.

5. The apparatus of claim 1, wherein the characteristic of the control signal comprises a derivative of a voltage level of the control signal.

6. The apparatus of claim 1, wherein the settling time is determined from a comparison of the derivative and a threshold voltage.

7. The apparatus of claim 1, wherein the voltage-controlled oscillator operates in a phase-locked loop.

* * * * *

(12) EX PARTE REEXAMINATION CERTIFICATE (8536th)
United States Patent
Groe et al.

(10) Number: US 7,109,815 C1
(45) Certificate Issued: Sep. 13, 2011

(54) VCO WITH AUTOMATIC CALIBRATION

(75) Inventors: John Groe, Poway, CA (US); Joseph Austin, San Diego, CA (US)

(73) Assignee: Quintic Holdings, Santa Clara, CA (US)

Reexamination Request:
No. 90/009,708, Apr. 23, 2010

Reexamination Certificate for:
Patent No.: 7,109,815
Issued: Sep. 19, 2006
Appl. No.: 11/027,793
Filed: Dec. 31, 2004

Related U.S. Application Data

(63) Continuation of application No. 10/418,732, filed on Apr. 17, 2003, now Pat. No. 6,856,205.
(60) Provisional application No. 60/373,177, filed on Apr. 17, 2002.

(51) Int. Cl.
*H03B 5/12* (2006.01)
*H03B 1/00* (2006.01)
*H03L 7/087* (2006.01)
*H03L 7/099* (2006.01)
*H03L 7/10* (2006.01)
*H03L 7/18* (2006.01)

(52) U.S. Cl. .......................... 331/179; 331/1 A; 331/11; 331/17; 331/36 C; 331/117 R; 331/177 V

(58) Field of Classification Search .................. None
See application file for complete search history.

(56) References Cited

U.S. PATENT DOCUMENTS 5,648,744 A   7/1997  Prakash et al. ............... 331/11
5,739,730 A   4/1998  Rotzoll ........................ 331/177

OTHER PUBLICATIONS

Tsung–Hsien Lin and William J. Kaiser, A 900–MHz 2.5–mA CMOS Frequency Synthesizer With An Automatic SC Tuning Loop, IEEE Journal of Solid State Circuits, vol. 36, No. 3, Mar. 2001.

*Primary Examiner* — John Heyman

(57) ABSTRACT

Voltage-controlled oscillator with apparatus for automatic calibration. The voltage-controlled oscillator includes switches connecting associated coarse-tuning capacitors to an LC resonant tank of the oscillator. The voltage-controlled oscillator also comprises a calibration loop used to appropriately set the switches associated with the coarse tuning capacitors based on a oscillator control signal.

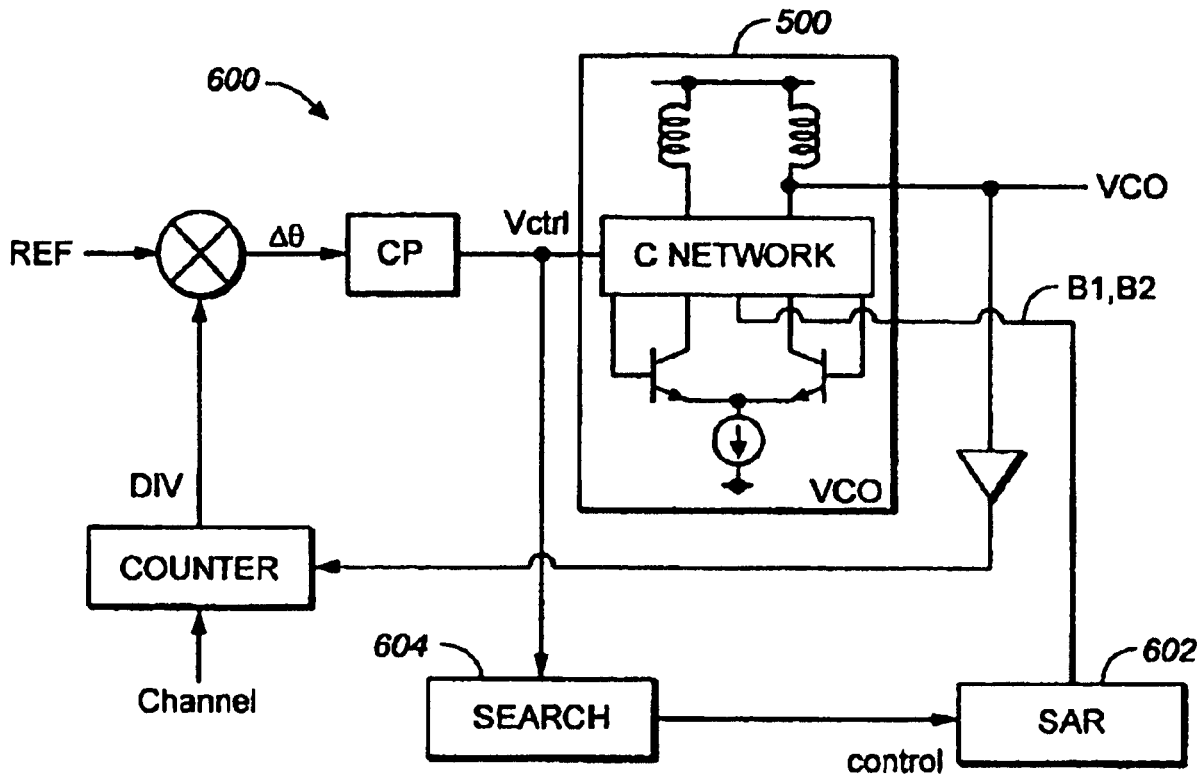

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 5 is cancelled.

Claims 1 and 6 are determined to be patentable as amended.

Claims 2-4 and 7, dependent on an amended claim, are determined to be patentable.

New claims 8-11 are added and determined to be patentable.

1. Apparatus for automatic tuning of a voltage-controlled oscillator, the apparatus comprising:
   one or more switches operable to selectively connect and disconnect one or more coarse-tuning elements to an LC resonant tank of the oscillator;
   logic configured to operate the one or more switches; and
   logic configured to provide a selected settling time based on a characteristic of a control signal, *wherein the characteristic of the control signal comprises a derivative of a voltage level of the control signal.*

6. [The apparatus of claim 1.] *Apparatus for automatic tuning of a voltage-controlled oscillator, the apparatus comprising:*
   *one or more switches operable to selectively connect and disconnect one or more coarse-tuning elements to an LC resonant tank of the oscillator;*
   *logic configured to operate the one or more switches; and*
   *logic configured to provide a selected settling time based on a characteristic of a control signal,* wherein the settling time is determined from a comparison of the derivative and a threshold voltage.

8. *The apparatus of claim 6, wherein the one or more coarse-tuning elements comprise one or more capacitors.*

9. *The apparatus of claim 6, wherein the one or more switches comprise one or more transistors.*

10. *The apparatus of claim 6, wherein the control signal comprises a voltage control signal input to the voltage controlled oscillator.*

11. *The apparatus of claim 6, wherein the voltage-controlled oscillator operates in a phase-locked loop.*

* * * * *